United States Patent [19]
Taylor

[11] Patent Number: 5,912,846
[45] Date of Patent: Jun. 15, 1999

[54] SERIAL FERROELECTRIC RANDOM ACCESS MEMORY ARCHITECTURE TO EQUALIZE COLUMN ACCESSES AND IMPROVE DATA RETENTION RELIABILITY BY MITIGATING IMPRINT EFFECTS

[75] Inventor: Craig Taylor, Colorado Springs, Colo.

[73] Assignee: Ramtron International Corporation, Colorado Springs, Colo.

[21] Appl. No.: 08/810,607

[22] Filed: Feb. 28, 1997

[51] Int. Cl.$^6$ .................................................. G11C 7/00
[52] U.S. Cl. ............... 365/189.05; 365/145; 365/230.08; 365/236
[58] Field of Search ............... 365/145, 189.05, 365/236, 230.08

[56] References Cited

U.S. PATENT DOCUMENTS

| | | | |
|---|---|---|---|
| 4,888,733 | 12/1989 | Mobley | 365/145 |
| 4,914,627 | 4/1990 | Eaton, Jr. et al. | 365/145 |
| 5,745,403 | 4/1998 | Taylor | 365/145 |
| 5,748,553 | 5/1998 | Kitamura | 365/189.05 X |
| 5,802,583 | 9/1998 | Yeager et al. | 365/189.05 X |
| 5,835,436 | 11/1998 | Ooishi | 365/230.03 |

OTHER PUBLICATIONS

"FM25160 Fram® Serial Memory Product Specification," ©1994 Ramtron International Corporation, 1850 ramtron Drive, Colorado Springs, CO 80921, pp. 2–34 through 2–40.

*Primary Examiner*—Do Hyun Yoo
*Attorney, Agent, or Firm*—William J. Kubida, Esq.; Holland & Hart LLP

[57] ABSTRACT

An architecture for a serial ferroelectric memory device that incorporates the provision of a latch intermediate the device memory array and column decoder of a width equal to a row in the array. In operation, the presence of the latch ensures that each write access to the memory device loads a row into the latch. Data is then modified while retained in the latch and written back to the memory array at the end of the cycle. A read operation can perform a write-back from the latch to the memory array at the beginning of the cycle after data is loaded into the latch. The addition of the latch intermediate the column decoder and the memory array then serves to ensure that for typical block read operations each column of the memory array will experience the same single write back cycle. As a consequence, data retention reliability for the memory device is improved by mitigating the effects of disparate imprint on the memory cells of the memory array.

20 Claims, 3 Drawing Sheets

SERIAL FERROELECTRIC RANDOM ACCESS MEMORY ARCHITECTURE TO EQUALIZE COLUMN ACCESSES AND IMPROVE DATA RETENTION RELIABILITY BY MITIGATING IMPRINT EFFECTS

CROSS REFERENCE TO RELATED PATENT APPLICATIONS

The present invention is related to U.S. patent application Ser. No. 08/810,608, filed on even date herewith for "System and Method for Mitigating Imprint Effect In Ferroelectric Random Access Memories Utilizing a Complementary Data Path", now U.S. Pat. No. 5,745,403, assigned to Ramtron International Corporation, Colorado Springs, Colo., assignee of the present invention, the disclosure of which is herein specifically incorporated by this reference.

BACKGROUND OF THE INVENTION

The present invention relates, in general, to the field of non-volatile, ferroelectric random access integrated circuit ("IC") memory devices. More particularly, the present invention relates to a serial ferroelectric random access memory architecture to equalize column accesses and improve data retention reliability by mitigating undesired imprint, or compensation, effects.

Ferroelectric memory devices, such as the FRAM® family of solid state, random access memory ("RAM") integrated circuits ("ICs") available from Ramtron International Corporation, Colorado Springs, Colo. provide non-volatile data storage through the use of a ferroelectric dielectric material which may be polarized in one direction or another in order to store a binary value. The ferroelectric effect allows for the retention of a stable polarization in the absence of an applied electric field due to the alignment of internal dipoles within the Perovskite crystals in the dielectric material. This alignment may be selectively achieved by application of an electric field which exceeds the coercive field of the material. Conversely, reversal of the applied field reverses the internal dipoles.

A hysteresis curve, wherein the abscissa and ordinate represent the applied voltage and resulting polarization states respectively, may be plotted to represent the response of the polarization of a ferroelectric capacitor to the applied voltage. A more complete description of this characteristic hysteresis curve is disclosed, for example, in U.S. Pat. Nos. 4,914,627 and 4,888,733 assigned to the assignee of the present invention, the disclosures of which are herein specifically incorporated by this reference.

Data stored in a ferroelectric memory cell is "read" by applying an electric field to the cell capacitor. If the field is applied in a direction to switch the internal dipoles, more charge will be moved than if the dipoles are not reversed. As a result, sense amplifiers can measure the charge applied to the cell bit lines and produce either a logic "1" or "0" at the IC output pins. In a conventional two transistor/two capacitor ("2T/2C") ferroelectric memory cell, a pair of two data storage elements are utilized, each polarized in opposite directions. To "read" the state of a 2T/2C memory cell, both elements are polarized in the same direction and the sense amps measure the difference between the amount of charge transferred from the cells to a pair of complementary bit lines. In either case, since a "read" to a ferroelectric memory is a destructive operation, the correct data is then restored to the cell during a precharge operation.

In a simple "write" operation, an electric field is applied to the cell capacitor to polarize it to the desired state. Briefly, the conventional write mechanism for a 2T/2C memory cell includes inverting the dipoles on one cell capacitor and holding the electrode, or plate, to a positive potential greater than the coercive voltage for a nominal 100 nanosecond ("nsec") time period. The electrode is then brought back to circuit ground for the other cell capacitor to be written for an additional nominal 100 nsec.

However, ferroelectric capacitors tend to be subject to "imprint". That is, they can become "compensated" wherein the hysteresis loop appears to shift to favor the stored state due to a charge build-up. Such imprint can result in an undesirably low signal level being presented to the sense amps upon the performance of subsequent "read" operations, thereby possibly indicating a device failure during test or providing a potentially erroneous indication of stored data. Because of their tendency to imprint, conventional ferroelectric memory devices may be sometimes viewed as perhaps better suited for use as read only memories ("ROMs") than random access memories ("RAMs"). Nevertheless, in many applications, a ferroelectric memory array either is or can be read quite often so a need exists for dealing with imprint characteristics such that its effects can be either reduced or negated their entirety.

Ferroelectric memory devices are generally available as both parallel access (c.f. Ramtron International Corporation FM1208S, FM1608S and FM1808S devices) and serial access (c.f. Ramtron International Corporation FM24C04, FM24C16, FM24164, FM25040 and FM25160 devices) integrated circuit memories. With respect to the latter category, serial memories are not typically accessed randomly because, in order to access one word of data in the device, serial transmission of the access operation code ("opcode" either a "read" or "write") and the word address is required. This means that for two-wire $I^2C$ (e.g. the FM24C04, FM24C16 and FM24164) and three-wire Serial Peripheral Interface ("SPI" e.g. the FM24164 and FM25040) compliant devices, (wherein both types are typically organized ×8, that is, one word=one byte) in order to access a single byte of data, it is necessary to transmit two bytes of data in order to read or write a single byte. As a consequence, these serial devices all include an address counter to increment the address so that several bytes of data can be either clocked in or out and only the starting address need be supplied.

As above described, current FRAM memory cell designs require a write back operation after every read (read/restore) because the state of the capacitor in the cell is actually switched to sense the charge and restored at the end of the cycle. The serial memory architecture used currently performs a row access after each address. Therefore, in order to write data to several sequential addresses, the first column will receive the initial write followed by several reinforcing writes (read/restore) while the last address will receive several restores with the old data followed by one write in the new state.

SUMMARY OF THE INVENTION

Disclosed herein is an architecture for a serial ferroelectric memory device that incorporates the provision of a latch intermediate the device memory array and column decoder of a width equal to a row in the array. In operation, the presence of the latch ensures that each write access to the memory device loads a row into the latch. Data is then modified while retained in the latch and written back to the memory array at the end of the cycle. A read operation can perform a write-back from the latch to the memory array at the beginning of the cycle after data is loaded into the latch. The addition of the latch intermediate the column decoder and the memory array then serves to ensure that for typical block read operations each column of the memory array will experience the same single write back cycle. As a consequence, data retention reliability for the memory device is improved by mitigating the effects of disparate imprint on the memory cells of the memory array.

BRIEF DESCRIPTION OF THE DRAWINGS

The aforementioned and other features and objects of the present invention and the manner of attaining them will become more apparent and the invention itself will be best understood by reference to the following description of a preferred embodiment taken in conjunction with the accompanying drawings, wherein.

DESCRIPTION OF A PREFERRED EMBODIMENT

Figure 1:
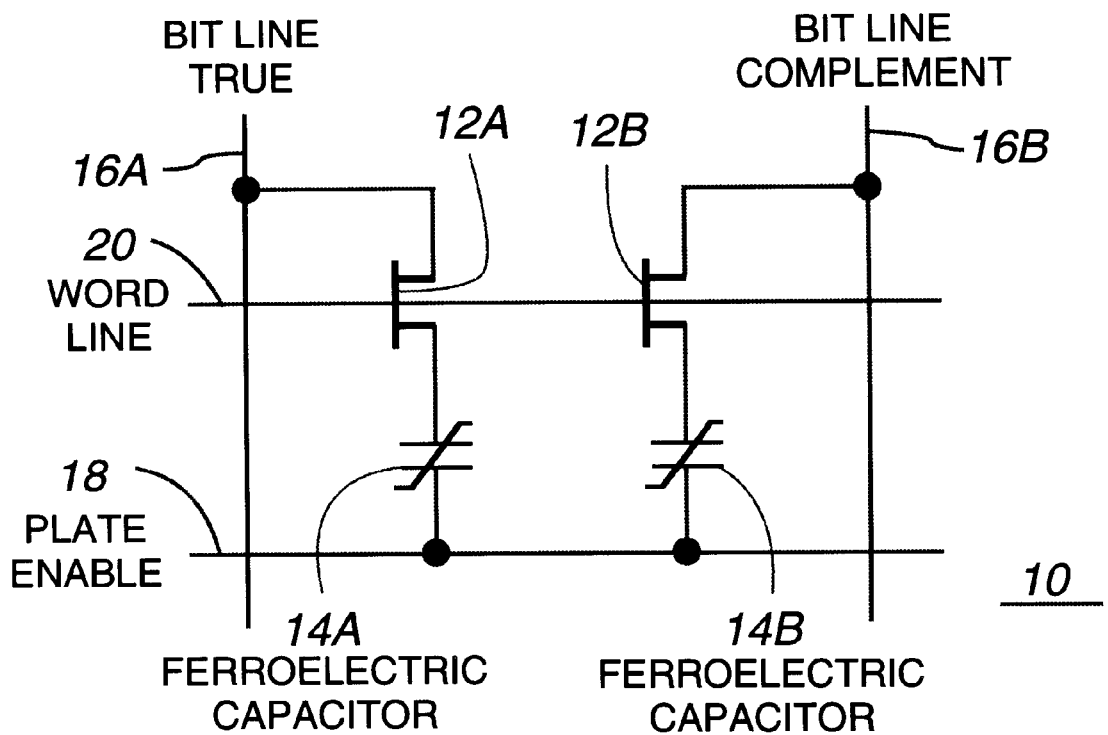
FIG. 1 is a schematic diagram of a prior art two transistor/two capacitor ("2T/2C") memory cell for use, for example, with the ferroelectric memory device of the succeeding FIG. 2, illustrating the differentially sensed Bit and /Bit lines for each such cell.

With reference now to FIG. 1, a prior art two transistor/two capacitor ("2T/2C") memory cell 10 of a ferroelectric memory device is shown. The memory cell 10 comprises, in pertinent part, a pair of pass transistors 12A and 12B coupled respectively in series with a capacitor 14A and a capacitor 14B. The pass transistor 12A has one terminal thereof coupled to a "true" bit line 16A and capacitor 14A has its remaining terminal coupled to a plate enable line 18. In like manner, the pass transistor 12B has one terminal thereof coupled to a complement bit line 16B and capacitor 14B has its remaining terminal thereof also connected to the plate enable line 18. The control terminals of transistors 12A and 12B are coupled to the memory array word line 20.

In operation, each of the capacitors 14A and 14B are polarized in opposite directions. To "read" the state of the memory cell 10, both capacitors 14A and 14B are polarized in the same direction and the memory device sense amplifiers (not shown) measure the difference between the amount of charge transferred from the capacitors 14A and 14B to the true and complement bit lines 16A and 16B. In either case, since a "read" to a ferroelectric memory cell 10 is a destructive operation, the correct data is then restored to the memory cell 10 during a precharge operation.

In a simple "write" operation, an electric field is applied to the memory cell 10 capacitors 14A and 14B to polarize them to the desired state. Briefly, the conventional write mechanism for the memory cell 10 includes inverting the dipoles on one cell capacitor (i.e. capacitor 14A) and holding the electrode, or plate enable line 18, to a positive potential greater than the coercive voltage for a nominal 100 nanosecond ("nsec.") time period. The electrode is then brought back to circuit ground for the other cell capacitor (i.e. capacitor 14B) to be written for an additional nominal 100 nsec.

The capacitors 14A and 14B may be conveniently furnished utilizing a ferroelectric dielectric such as the proprietary lead zirconate titanate ("PZT") developed by Ramtron International Corporation. Alternatively, strontium bismuth tantalate ("SBT") or other suitable ferroelectric dielectric may be utilized.

Figure 2:
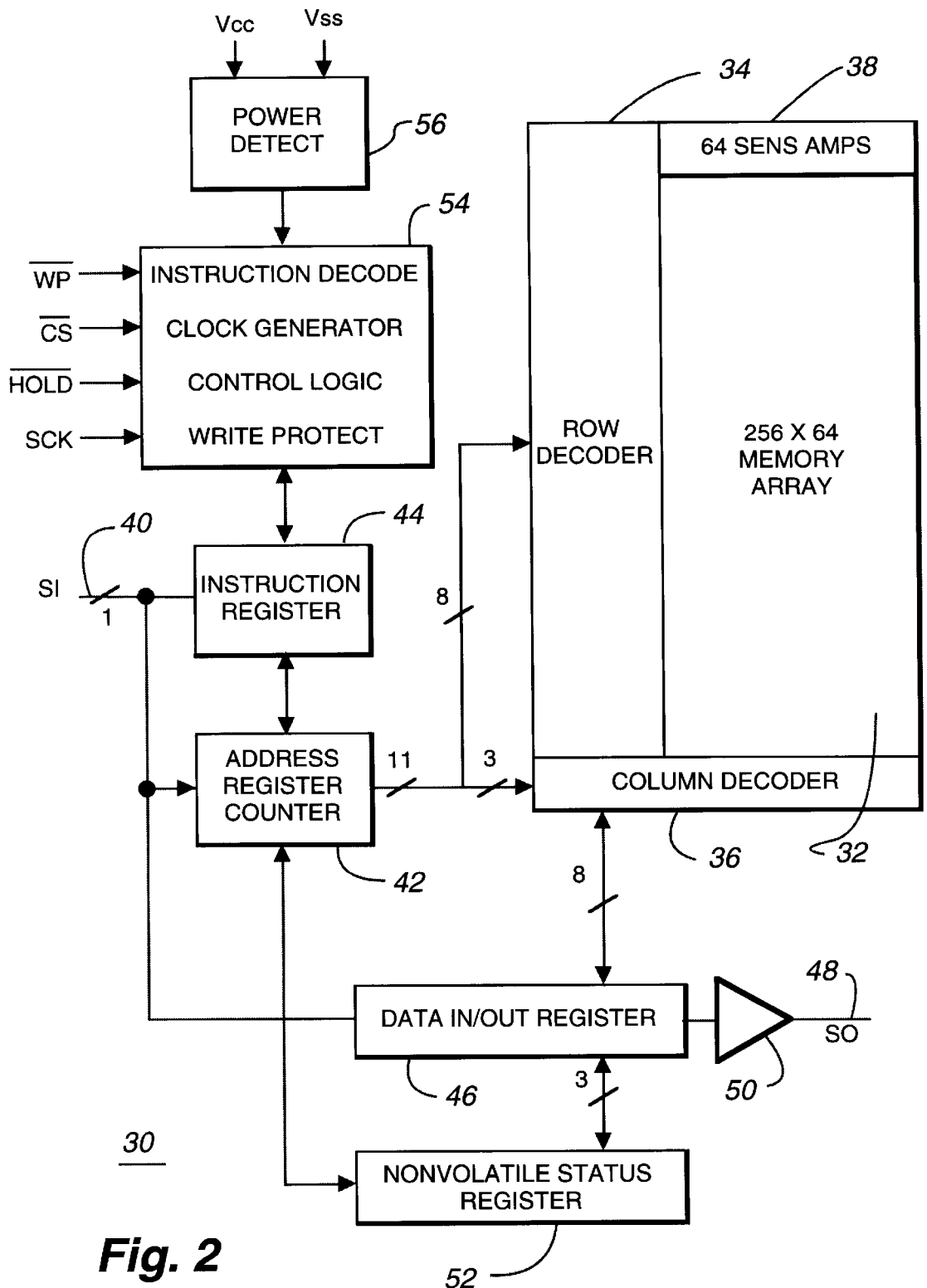
FIG. 2 is a functional block diagram of an exemplary prior art ferroelectric memory device, such as the FM25160 FRAM serial memory available from Ramtron International Corporation, which incorporates an array of the memory cells of the preceding FIG. 1 and is instructive in understanding the operation of a conventional serial ferroelectric memory device.

With reference additionally now to FIG. 2, an exemplary prior art ferroelectric memory device 30 in the form of a FM25160 FRAM serial memory available from Ramtron International Corporation is shown. The memory device 30 incorporates a 16 Kbit array 32 of the memory cells 10 of the preceding FIG. 1 arranged as 256×64, or 256 rows of 64 bits. Each row of the array 32 has eight columns (0 through 7) of eight bits each. Data stored or to be stored in the array 32 is accessible by means of an associated row decoder 34 and column decoder 36. The data maintained within the memory cells of the array 32 is read out as previously described by means of a number of sense amplifiers 38 coupled to the true and complement bit lines of the various memory cells.

Data is input to the memory device 30 via a serial input ("SI") 40 providing one input to an address register counter 42 which is, in turn, coupled to supply address signals to the row decoder 34 and column decoder 36. The serial input 40 is also coupled to an instruction register 44 which is bidirectionally coupled to the address register counter 42 and other functional logic blocks as will be more fully described hereinafter.

The serial input 40 is further coupled to a data in/out register 46 which is bidirectionally coupled to the column decoder 36 via an eight bit bus. The output of the data in/out register 46 is supplied to serial output ("SO") 48 through a buffer amplifier. As shown, a nonvolatile status register 52 is bidirectionally coupled to the data in/out register 46 via a three bit bus as well as to the address register counter 42.

The memory device 30 also incorporates a logic block 54 which is bidirectionally coupled to the instruction register 44 and receives as inputs an active low write protect ("WP"), chip select ("/CS") and hold ("/HOLD") signals as well as a serial clock ("SCK") signal. The logic block 54 functions as an instruction decoder, on-chip clock generator, control logic and write protection block. The logic block 54 receives as input a power detection signal from a power detection block 56 which is coupled to the memory device voltage inputs $V_{CC}$ and $V_{SS}$.

The exemplary memory device 30 is an SPI compatible device which utilizes an industry standard three-wire protocol for serial chip communication with the SPI port on various microprocessors. The SPI communications channel uses three wires (SCK, SI and SO) that can be shared among a number of devices. The /CS input selects the device on the time multiplexed bus that should respond to any given access request. The SPI channel affords access to any byte of data. within the memory array 32.

The serial output 48 is active only during a read operation and is held at high impedance at all other times when the /HOLD signal is low. During a read operation, the serial output 48 is driven high or low depending on the current data output bit. Data is clocked out of the memory device 30 on the falling edge of the SCK signal. It should also be noted that the SPI protocol allows for a mode in which data may be clocked out on the rising edge of the SCK signal and out on its falling edge.

Data is clocked into the memory device 30 via the serial input 40 on the rising edge of the SCK signal and beyond the setup and hold times around this clock edge, the state on this input is ignored. In general, data is clocked into or out of the memory device 30 utilizing the SCK signal when /CS is low and /HOLD is high. Input values are latched on the rising edge while data output changes occur after the falling edge of SCK. When the /CS signal is low, the memory device 30 will respond to transitions on the SCK signal. When it is high, inputs are ignored, outputs are place in a high impedance state and the memory device 30 enters a low power standby mode of operation. A high to low transition is required on this pin before each opcode.

The /WP signal provides a hardware write protect for the nonvolatile status register 52. The /HOLD signal may be utilized to pause the sequence if the associated central processing unit ("CPU") must process some other even in the midst of an operation. While the /HOLD signal is low, the memory device 30 will ignore any transitions of the SCK and /CS signals. When /HOLD is high, all operations will proceed normally and transitions of the /HOLD signal must occur while the SCK signal is low.

In operation, data is transferred to and from the memory device 30 in bytes of eight bits each, as governed by the edges of the SCK signal. Data is transferred with the most significant bit ("MSB") first. For any operation, the first byte to be transferred is the opcode which determines the operations to performed by the memory device 30. The various operations include: set write enable latch, write disable, read status register, write status register, read data and write data.

For a read or write operation, an address byte must be transmitted to the memory device 30 after the opcode. Following the address byte, the data bytes are transferred MSB first. Any number of bytes may be read or written in sequential order starting with the specified address and wrapping around to address 0 after the bye at address 7FF (Hex) is accessed. The read or write operation then continues until the /CS signal is brought high. It should be noted that the actual write to the non-volatile array 32 takes place after the eighth bit in each byte is transmitted. If the /CS signal rises during a write operation, only the byte that has not been completely transmitted will be ignored.

The memory device 30 read protocol is initiated by the master device asserting an active low /CS signal. The next rising edge of SCK begins the input clocking of the opcode into the memory device 30. After the eight bit opcode is clocked in, the byte address follows. Data is shifted out of the memory device 30 on serial output 48 immediately following the byte address using the falling edge of the SCK signal. Data can then be continuously shifted out of the memory device 30 by continually supplying clock pulses. When the highest byte address is read, the address register counter 42 wraps to zero and the read operation continues. The read operation is terminated by bringing the /CS signal high.

Write protocol is enabled by the master device initiating a set write enable latch ("WREN") signal on the serial input 40. The /CS signal is brought high after the least significant bit ("LSB") of the WREN instruction is transmitted from the master device to the memory device 30. The master device writes the write opcode, byte address and any number of sequential bytes to the memory device 30. The operation is terminated by taking the /CS signal high after the LSB in the last data byte.

As earlier described, the array 32 of the memory device 30 is 16 Kbits organized as 256×64 or 256 rows of 64 bits. Each row of the array 32 has eight columns (0 through 7) of eight bits each. An access begins with Chip Select ("/CS") going low followed by eight bits of opcode and eight bits of address clocked in serially (at the maximum clock frequency this takes 7.6 μsec.).

As an example, and with reference to following Table 1., a write operation of eight bytes to the first eight locations in the memory will serve as an illustration. The memory device 30 latches the address, sets up the address register counter 42 and accesses the appropriate row and column (Row 0, Col 0 in this case) by means of the row decoder 34 and column decoder 36. The memory device 30 then shifts in eight bits to a shift register (the data in/out register 46) and writes the data to the array 32. The entire row is accessed, the first column (Col 0) is changed and the next seven columns (Col 1 through 7) are written back with the previous state. Since the /CS signal is still low and has not as yet gone high (a "stop" condition) the address register counter 42 is incremented and the memory device 30 then performs the second access to the array 32 (Row 0, Col 1) and at this point, the second eight data bits are shifted in and subsequently written to the array 32. This operation then causes a read/restore cycle to occur on Col 0. Upon completion of eight sequential writes (eight bytes) the data in column 0 has, therefore, been changed (or written) and also written back in that state seven times which is equivalent to eight writes. In turn, column 1 receives one write back in the previous state and the equivalent of seven writes (i.e. written and written back six times) in the new state and so on. Ultimately, column 7 receives seven write backs in the previous state and one writing or data in the new state. Therefore, since multiple writes inherently serve to mitigate the effects of imprint, column 0 is written many times in the new state while column 7 is imprinting in the previous state with only one ultimate write in the new state. Block read and write operations are typically the type of accesses utilized during memory device 30 initial test as well as in actual use due to the relatively large operational overhead of necessity incurred in transferring opcode and address data to the memory device 30.

TABLE 1

|  | Row 0, Col 0 | Row 0, Col 1 | Row 0, Col 2 | Row 0, Col 3 | Row 0, Col 4 | Row 0, Col 5 | Row 0, Col 6 | Row 0, Col 7 |
| --- | --- | --- | --- | --- | --- | --- | --- | --- |
| Write 1st 8 bits | Write New Data | Write Back Previous State | Write Back Previous State | Write Back Previous State | Write Back Previous State | Write Back Previous State | Write Back Previous State | Write Back Previous State |
| Write 2nd 8 bits | Write Back New State | Write New Data | Write Back Previous State | Write Back Previous State | Write Back Previous State | Write Back Previous State | Write Back Previous State | Write Back Previous State |

TABLE 1-continued

| | Row 0, Col 0 | Row 0, Col 1 | Row 0, Col 2 | Row 0, Col 3 | Row 0, Col 4 | Row 0, Col 5 | Row 0, Col 6 | Row 0, Col 7 |
|---|---|---|---|---|---|---|---|---|
| Write 3rd 8 bits | Write Back New State | Write Back New State | Write New Data | Write Back Previous State | Write Back Previous State | Write Back Previous State | Write Back Previous State | Write Back Previous State |
| Write 4th 8 bits | Write Back New State | Write Back New State | Write Back New State | Write New Data | Write Back Previous State | Write Back Previous State | Write Back Previous State | Write Back Previous State |
| Write 5th 8 bits | Write Back New State | Write Back New State | Write Back New State | Write Back New State | Write New Data | Write Back Previous State | Write Back Previous State | Write Back Previous State |
| Write 6th 8 bits | Write Back New State | Write Back New State | Write Back New State | Write Back New State | Write Back New State | Write New Data | Write Back Previous State | Write Back Previous State |
| Write 7th 8 bits | Write Back New State | Write Back New State | Write Back New State | Write Back New State | Write Back New State | Write Back New State | Write New Data | Write Back Previous State |
| Write 8th 8 bits | Write Back New State | Write Back New State | Write Back New State | Write Back New State | Write Back New State | Write Back New State | Write Back New State | Write New Data |

Figure 3:
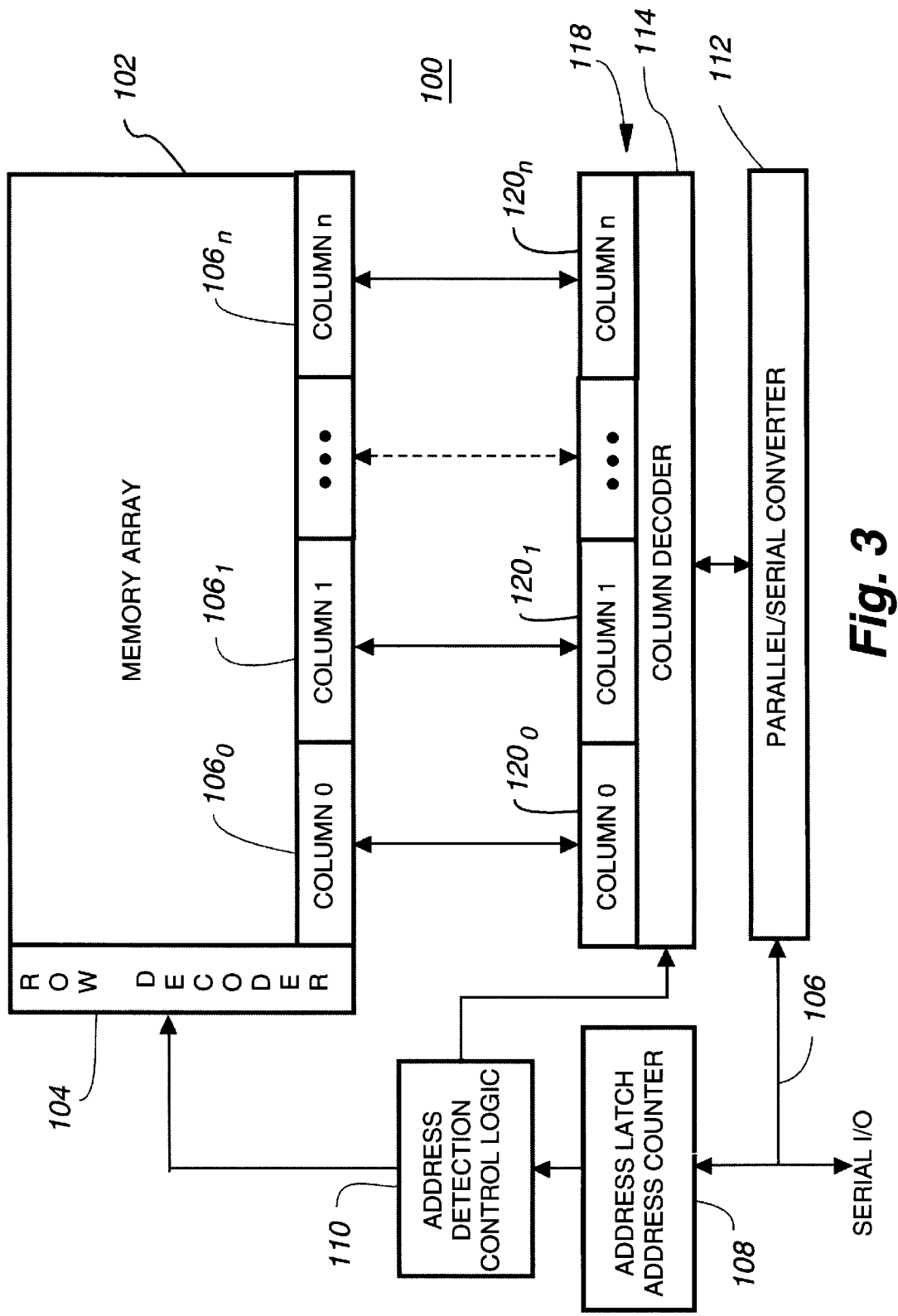
FIG. 3 is a functional block diagram of a serial ferroelectric memory device in accordance with the present invention providing for equalization of column access to improve data retention reliability by mitigation of imprint effects.

With reference additionally now to FIG. 3, a serial memory device 100 in accordance with the present invention is shown. The memory device 100 comprises, in pertinent part, a memory array 10:2 comprising, for example, a plurality of the memory cells 10 of FIG. 1 or, alternatively, single transistor/single capacitor ("1T/1C") or other ferroelectric memory cells arranged in a number of rows and columns.

The memory array 102 is accessible for reading data therefrom, or writing data thereto at selected memory locations by means of an associated row decoder 104 and column decoder 114. Data may be input to, and output from, the memory device 100 by means of a serial input/output ("I/O") line 106 which is bidirectionally coupled to an address latch and address counter 108 for receiving address information input to the memory device 100. The address latched in the address latch and address counter 108 is then supplied as an input to an address detection and control logic block 110 for providing appropriate row and column address to the row decoder 104 and column decoder 114 as shown. The data received on the serial I/O line 106 is also input to a parallel/serial converter 112 which is bidirectionally coupled to the column decoder 114 by means of an n bit data bus. Data read from the memory array 102 may also be loaded into parallel/serial converter for output from the memory device 100 on the serial I/O line 106.

As shown, the memory array 102 comprises a number of columns of memory cells which may, be denominated column 0 ($106_0$) through column n ($106_n$). In an exemplary implementation of a memory device 100, there may be eight columns $106_0$ through $106_7$ providing for an eight bit per column, or 64 bit row width. In accordance with the present invention, the memory device 100 also incorporates a latch 118 of a width corresponding to the row width, in this instance 64 bits. The latch 118 may then comprise a number of eight bit latches denominated column 0 ($120_0$) through column n ($120_n$) inclusive.

In operation, the presence of the latch 118 ensures that each write access to the memory device 100 loads a row into the latch 118. Data is then modified while retained within the latch 118 and written back to the memory array 102 at the end of the cycle. A read operation can perform a write-back from the latch 118 to the memory array 102 at the beginning of the cycle after data is loaded into the latch 118. The addition of the latch 118 intermediate the column decoder 114 and the memory array 102 then serves to ensure that for typical block read operations (eight bytes in the example shown) each column of the memory array 102 will experience the same one write back cycle. As a consequence, data retention reliability for the memory device 100 is improved by mitigating the effects of imprint on the memory cells of the memory array 102.

While there have been described above the principles of the present invention in conjunction with specific $I^2C$ compliant serial ferroelectric memory device, it is to be clearly understood that the foregoing description is made only by way of example and not as a limitation to the scope of the invention. The principles of the present invention are also applicable to SPI and other industry standard compliant serial ferroelectric memory devices as well as those utilizing either 1T/1C or 2T/2C memory cells. Particularly, it is recognized that the teachings of the foregoing disclosure will suggest other modifications to those persons skilled in the relevant art. Such modifications may involve other features which are already known per se and which may be used instead of or in addition to features already described herein. Although claims have been formulated in this application to particular combinations of features, it should be understood that: the scope of the disclosure herein also includes any novel feature or any novel combination of features disclosed either explicitly or implicitly or any generalization or modification thereof which would be apparent to persons skilled in the relevant art, whether or not such relates to the same invention as presently claimed in any claim and whether or not it mitigates any or all of the same technical problems as confronted by the present invention. The applicants hereby reserve the right to formulate new claims to such features and/or combinations of such features during the prosecution of the present application or of any further application derived therefrom.

What is claimed is:

1. A memory device comprising a memory array arranged in rows and columns of memory cells, each of said memory cells being accessible by means of an associated row decoder and a column decoder for writing data to said memory array and reading data therefrom, said memory device comprising:

a latch interposed between said column decoder and said memory array, said latch corresponding in width to a number of said columns in each of said rows of said memory array, said data to be written to a selected row of said memory array being held in said latch until all of said data to be written to said selected one of said rows of said memory array has been latched therein.

2. The memory device of claim 1 wherein said memory cells comprise at least one capacitor having a ferroelectric dielectric and an associated pass transistor.

3. The memory device of claim 2 wherein said ferroelectric dielectric comprises lead zirconate titanate.

4. The memory device of claim 2 wherein said ferroelectric dielectric comprises strontium bismuth tantalate.

5. The memory device of claim 2 wherein said memory cell comprises a pair of complementary capacitors each having an associated pass transistor.

6. The memory device of claim 1 wherein said memory device is a serial memory device.

7. The memory device of claim 1 further comprising:

an address counter for indicating a next selected one of said rows of said memory array for said row decoder, said latch being reloadable such that additional data intended to be written to said next selected one of said rows of said memory array may be held in said latch until all of said data intended to be written to said next selected one of said rows of said memory array has been latched therein.

8. The memory device of claim 1 wherein said latch is additionally loadable with another selected row of data from said memory array, said another selected row of data being rewritten back to said another selected row of said memory array after being read form said latch.

9. A memory device comprising:

a memory array including a plurality of memory cells arranged in a plurality of rows and columns;

a row decoder coupled to said memory array for selectively accessing selected ones of said plurality of rows; and a column decoder for selectively accessing selected ones of said plurality of columns, said column decoder being coupled to said memory array through a latch corresponding in width to a number of said columns in each of said rows of said memory array, said data to be written to a selected one of said rows of said memory array being held in said latch until all of said data intended to be written to said selected one of said rows of said memory array has been latched therein.

10. The memory device of claim 9 wherein said memory cells comprise at least one capacitor having a ferroelectric dielectric and an associated pass transistor.

11. The memory device of claim 10 wherein said ferroelectric dielectric comprises lead zirconate titanate.

12. The memory device of claim 10 wherein said ferroelectric dielectric comprises strontium bismuth tantalate.

13. The memory device of claim 10 wherein said memory cell comprises a pair of complementary capacitors each having an associated pass transistor.

14. The memory device of claim 9 wherein said memory device is a serial memory device.

15. The memory device of claim 9 further comprising:

an address counter for indicating a next selected one of said rows of said memory array for said row decoder, said latch being reloadable such that additional data intended to be written to said next selected one of said rows of said memory array may be held in said latch until all of said data intended to be written to said next selected one of said rows of said memory array has been latched therein.

16. The memory device of claim 9 wherein said latch is additionally loadable with another selected row of data from said memory array, said another selected row of data being rewritten back to said another selected row of said memory array after being read form said latch.

17. A method for accessing data in a memory device including a memory array comprising a plurality of memory cells arranged in a number of rows and columns thereof, said memory array having associated row and column decoders for accessing selected columns of said memory cells in a selected row thereof, said method comprising the steps of:

providing a latch intermediate said column decoder and said memory array having a width corresponding to a number of said columns in said selected row of said memory array;

loading subsets of a row of data intended to be written to said selected row of said memory array to said latch; and writing said row of data to said selected row of said memory array when all of said subsets of said row of data have been stored in said latch.

18. The method of claim 17 further comprising the steps of:

loading another row of data to be read from another selected row of said memory array to said latch;

reading out said another row of data loaded to said latch from said memory device; and writing said another row of data loaded to said latch back to said another selected row of said memory array.

19. A method for accessing data in a memory device including a memory array comprising M rows and N columns of memory cells, said memory array having associated row and column decoders for sequentially accessing first through last ones of said N columns of said memory cells in each of said M rows thereof, said method comprising the steps of:

providing a latch intermediate said column decoder and said memory array having a width corresponding to said N columns in a selected one of said M rows of said memory array;

serially loading said first through last ones of said N columns of a row of data intended to be written to said selected one of said M rows of said memory array to said latch; and writing said row of data to said selected one of said M rows of said memory array when all of said first through last ones of said N columns of said row of data have been stored in said latch.

20. The method of claim 19 further comprising the steps of:

loading another row of first through last ones of said N columns of data to be read from another selected one of said M rows of said memory array to said latch;

reading out said another one of said M rows of data loaded to said latch from said memory device; and writing said another one of said M rows of data loaded to said latch back to said another selected one of said M rows of said memory array.

* * * * *